(12) United States Patent
Verma et al.

(10) Patent No.: US 7,606,279 B1
(45) Date of Patent: Oct. 20, 2009

(54) THIN INP SPACER LAYER IN A HIGH SPEED LASER FOR REDUCED LATERAL CURRENT SPREADING

(75) Inventors: Ashish K. Verma, San Jose, CA (US); Sumesh Mani K. Thiyagarajan, Fremont, CA (US); David Bruce Young, Oakland, CA (US); Yuk Lung Ha, San Jose, CA (US); Roman Dimitrov, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/749,033

(22) Filed: May 15, 2007

Related U.S. Application Data (60) Provisional application No. 60/800,507, filed on May 15, 2006.

(51) Int. Cl.
*H01S 5/00* (2006.01)
(52) U.S. Cl. ............... 372/45.01; 372/43.01; 372/46.01
(58) Field of Classification Search .............. 372/43.01, 372/45.01, 46.01
See application file for complete search history.

(56) References Cited

U.S. PATENT DOCUMENTS

| | | | |
|---|---|---|---|
| 4,092,659 A | 5/1978 | Ettenberg | |
| 4,740,987 A | 4/1988 | McCall et al. | |
| 4,859,628 A | 8/1989 | Knight et al. | |
| 4,951,292 A | 8/1990 | Kuindersma et al. | |
| 5,208,821 A | 5/1993 | Berger et al. | |
| 5,450,432 A | 9/1995 | Okuda | |
| 5,675,601 A | 10/1997 | Karakida et al. | |
| 5,793,787 A | 8/1998 | Meyer et al. | |
| 6,219,366 B1 | 4/2001 | Furushima | |
| 6,618,410 B1 | 9/2003 | Fischer et al. | |
| 2002/0037024 A1 | 3/2002 | Huang | |
| 2002/0114367 A1 | 8/2002 | Stintz et al. | |
| 2002/0117675 A1* | 8/2002 | Mascarenhas | 257/87 |
| 2003/0002557 A1 | 1/2003 | Eng et al. | |
| 2003/0179795 A1 | 9/2003 | Moriya et al. | |
| 2004/0079967 A1 | 4/2004 | Shakuda et al. | |

(Continued)

FOREIGN PATENT DOCUMENTS

JP    2000-340894    12/2000

OTHER PUBLICATIONS

Sexl, M., Bohm G., Maier, M., Tranke, G., Weimann, G., & Abstreiter, G. (1997), MBE Growth of Metamorphic In(Ga)AlAs Buffers. 1997 IEEE International Symposium on Compound Semiconductors, IEEE, 49-52.

(Continued)

*Primary Examiner*—Dung T Nguyen
(74) *Attorney, Agent, or Firm*—Workman Nydegger (57) ABSTRACT

Embodiments disclosed herein relate to high-speed lasers such as FP and DFB lasers. In one embodiment, the high speed laser comprises a substrate, an active region positioned above the substrate, a mesa positioned above the active region, and one or more layers disposed between the active region and the mesa, wherein the thickness of at least one of the one or more layers is implemented to at least partially minimize the distance between the mesa and active region such that lateral current spreading between the mesa and the active region is at least partially minimized.

20 Claims, 4 Drawing Sheets

U.S. PATENT DOCUMENTS

2004/0086017 A1    5/2004    Yoshida et al.
2004/0190835 A1*   9/2004    Burdick et al. ................ 385/89
2005/0031000 A1    2/2005    Botez

OTHER PUBLICATIONS

Sudo, Tsurugi, et al., Semiconductor Laser Having Low Stress Passivation Layer, U.S. Appl. No. 11/749,047, filed May 15, 2007.
Ha, Yuk Lung, et al., Epitaxial Regrowth in a Distributed Feedback Laser, U.S. Appl. No. 11/749,007, filed May 15, 2007.
Dimitrov, Roman, et al., Method for Applying Protective Laser Facet Coatings, U.S. Appl. No. 11/749,052, filed May 15, 2007.
Dimitrov, Roman, et al., High Resistivity Engineered Laser Facet Coatings, U.S. Appl. No. 11/749,057, filed May 15, 2007.
Dimitrov, Roman, et al., Laser Facet Pre-Coating Etch for Controlling Leakage Current, U.S. Appl. No. 11/749,061, filed May 15, 2007.
Young, David Bruce, et al., Semiconductor Laser Having a Doped Active Layer, U.S. Appl. No. 11/749,013, filed May 15, 2007.
U.S. Appl. No. 11/749,013, Oct. 29, 2008, Office Action.
U.S. Appl. No. 11/749,013, Feb. 25, 2009, Notice of Allowance.
U.S. Appl. No. 11/749,047, Aug. 12, 2008, Office Action.
U.S. Appl. No. 11/749,047, Feb. 6, 2009, Notice of Allowance.
U.S. Appl. No. 11/749,007, Dec. 9, 2008, Office Action.
U.S. Appl. No. 11/749,057, Dec. 11, 2008, Office Action.

* cited by examiner

THIN INP SPACER LAYER IN A HIGH SPEED LASER FOR REDUCED LATERAL CURRENT SPREADING

CROSS-REFERENCE TO RELATED APPLICATIONS

This application claims the benefit of U.S. Provisional Application No. 60/800,507, filed May 15, 2006, which is incorporated herein by reference in its entirety.

BACKGROUND

Semiconductor lasers are currently used in a variety of technologies and applications, including communications networks. One type of semiconductor laser is the distributed feedback ("DFB") laser. The DFB laser produces a stream of coherent, monochromatic light by stimulating photon emission from a solid state material. DFB lasers are commonly used in optical transmitters, which are responsible for modulating electrical signals into optical signals for transmission via an optical communication network.

Generally, a DFB laser includes a positively or negatively doped bottom layer or substrate, and a top layer that is oppositely doped with respect to the bottom layer. An active region, bounded by confinement regions, is included at the junction of the two layers. These structures together form the laser body. A coherent stream of light that is produced in the active region of the DFB laser can be emitted through either longitudinal end, or facet, of the laser body. One facet is typically coated with a high reflective material that redirects photons produced in the active region toward the other facet in order to maximize the emission of coherent light from that facet end. A grating is included in either the top or bottom layer to assist in producing a coherent photon beam. DFB lasers are typically known as single mode devices as they produce light signals at one of several distinct wavelengths, such as 1,310 nm or 1,550 nm. Such light signals are appropriate for use in transmitting information over great distances via an optical communications network.

In traditional DFB lasers and other high-speed ridge waveguide lasers, there is often excessive lateral current spreading in various layers between the bottom of the ridge and the active region that results in reduced injection of carriers into the action region. This reduces both the gain and differential gain, which in turn can negatively affect both the DC and RF performance characteristics of the laser.

BRIEF SUMMARY

Embodiments disclosed herein relate to high-speed lasers such as FP and DFB lasers. In one embodiment, the high speed laser comprises a substrate, an active region positioned above the substrate, a mesa positioned above the active region, and one or more layers disposed between the active region and the mesa, wherein the thickness of at least one of the one or more layers is implemented to minimize the distance between the mesa and active region such that lateral current spreading between the mesa and the active region is minimized.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows, and in part will be obvious from the description, or may be learned by the practice of the embodiments disclosed herein. The features and advantages of the embodiments disclosed herein may be realized and obtained by means of the instruments and combinations particularly pointed out in the appended claims. These and other features of the embodiments disclosed herein will become more fully apparent from the following description and appended claims, or may be learned by the practice of the embodiments disclosed herein as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

The principles of the present invention relate to a structure of a DFB laser that in some embodiments may be implemented to reduce lateral current spreading. An example DFB laser structure will first be described. The operation of the DFB laser will then be described in relation to the example structure.

Reference will now be made to figures wherein like structures will be provided with like reference designations. It is understood that the drawings are diagrammatic and schematic representations of presently preferred embodiments of the invention, and are not limiting of the present invention nor are they necessarily drawn to scale.

Example Operating Environment

Figure 1:
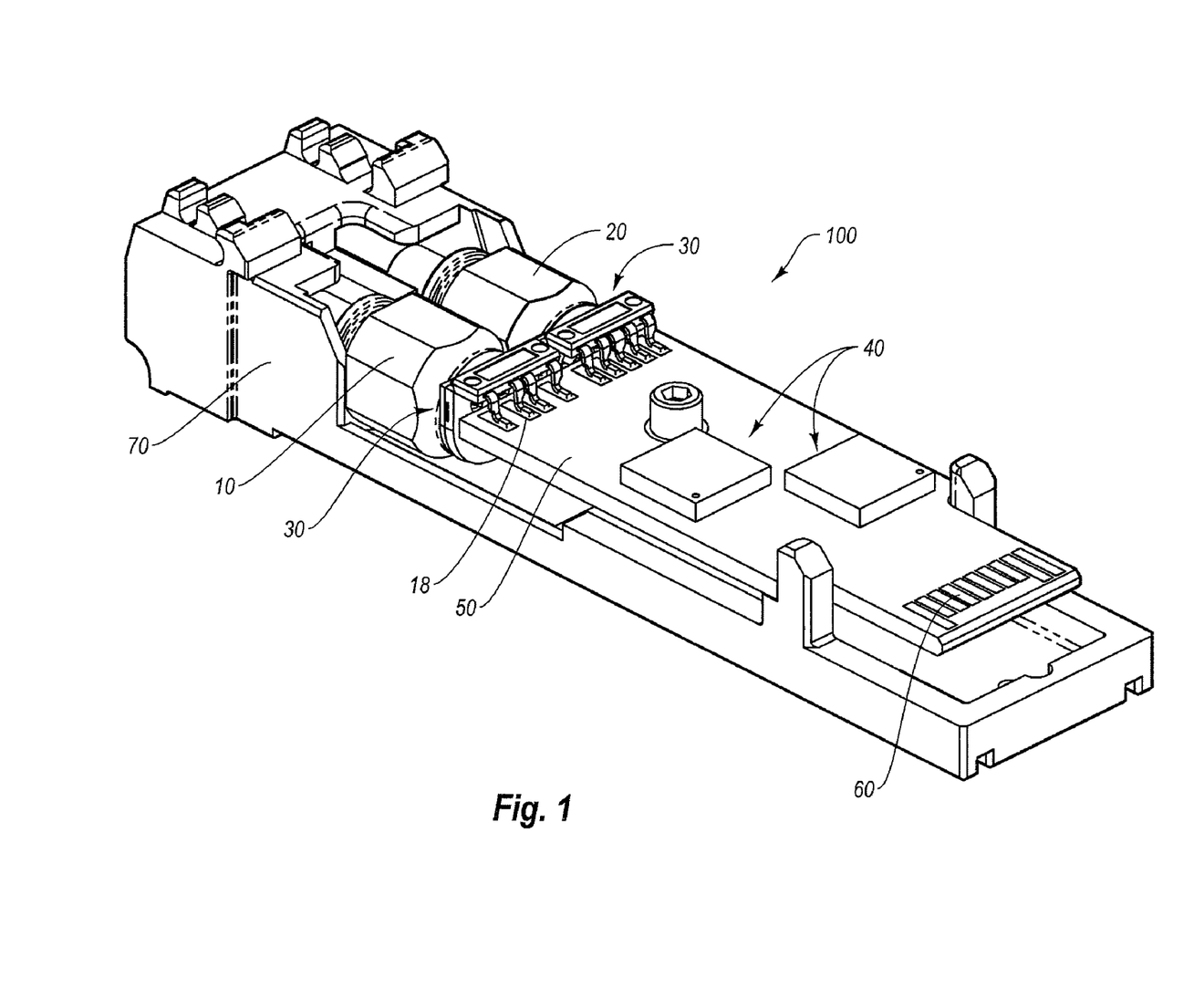
FIG. 1 is a perspective view of an optical transceiver module that serves as one exemplary environment in which embodiments of the present invention can be practiced.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a receiver optical subassembly ("ROSA") 10, a transmitter optical subassembly ("TOSA") 20, electrical interfaces 30, various electronic components 40, and a printed circuit board ("PCB") 50. In detail, two electrical interfaces 30 are included in the transceiver 100, one each used to electrically connect the ROSA 10 and the TOSA 20 to a plurality of conductive pads 18 located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20, and the host. In addition, the above-mentioned components of the transceiver 100 are partially housed within a shell 70. Though not shown, the shell 70 can cooperate with a housing portion to define a covering for the components of the transceiver 100.

While discussed in some detail here, the optical transceiver 100 is described by way of illustration only, and not by way of restricting the scope of the invention. As mentioned above, the optical transceiver 100 in one embodiment is suitable for optical signal transmission and reception at a variety of per-second data rates, including but not limited to 1 Gbit, 2 Gbit, 2.5 Gbit, 4 Gbit, 8 Gbit, 10 Gbit, or higher rates. Furthermore, the principles of the present invention can be implemented in optical transmitters and transceivers of shortwave and long wave optical transmission and any form factor such as XFP, SFP and SFF, without restriction.

The TOSA 20 of the transceiver 100 is one example of an optical transmitter that can employ an optical source, such as a semiconductor laser, that is configured according to embodiments of the present invention. Briefly, in operation the transceiver 100 receives electrical signals from a host (not shown) or other data signal-producing device to which the transceiver is operably connected for transmission onto an optical fiber operably connected to the TOSA 20. Circuitry of the transceiver 100 drives a laser (described below) within the TOSA 20 with signals that cause the TOSA to emit onto the optical fiber optical signals representative of the information in the electrical signal provided by the host. Accordingly, the TOSA 20 serves as an electro-optic transducer. Having described a specific environment with respect to FIG. 1, it will be understood that this specific environment is only one of countless architectures in which the principles of the present invention may be employed. As previously stated, the principles of the present invention are not intended to be limited to any particular environment.

Example Distributed Feedback Laser

A distributed feedback ("DFB") laser is one example of a semiconductor optical device employed according to embodiments of the present invention. By way of general overview, a DFB laser contains a cavity having an active medium and a distributed reflector that operates in a wavelength range of the laser action. The DFB laser has multiple modes, including both longitudinal and transversal modes, but one of these modes will typically offer better loss characteristics relative to the other modes. This single mode typically defines a single-frequency operation of the DFB laser.

The following description provides various details regarding a ten gigabit/second ("10 G") DFB laser configured for light emission at a wavelength of approximately 1310 nm. The following description includes both structural and functional characteristics of the 10 G DFB laser, together with certain details regarding the manufacturing processes used to build the laser. Note, however, that this description is meant to be exemplary only; indeed, lasers and other semiconductor optical devices having structural and/or functional aspects that differ from the present description can also benefit from the principles of embodiments of the present invention as disclosed herein. It is also appreciated that additional or alternative layers, layer thicknesses, or structures can be incorporated into the present laser device as will be understood by those of skill in the art. The following discussion is therefore not intended to limit the present invention in any way. In particular, the principles of the present invention may also be achieved in a 1310 nm 2.5 G DFB laser.

a. Base Epitaxial Layers

Figure 2:
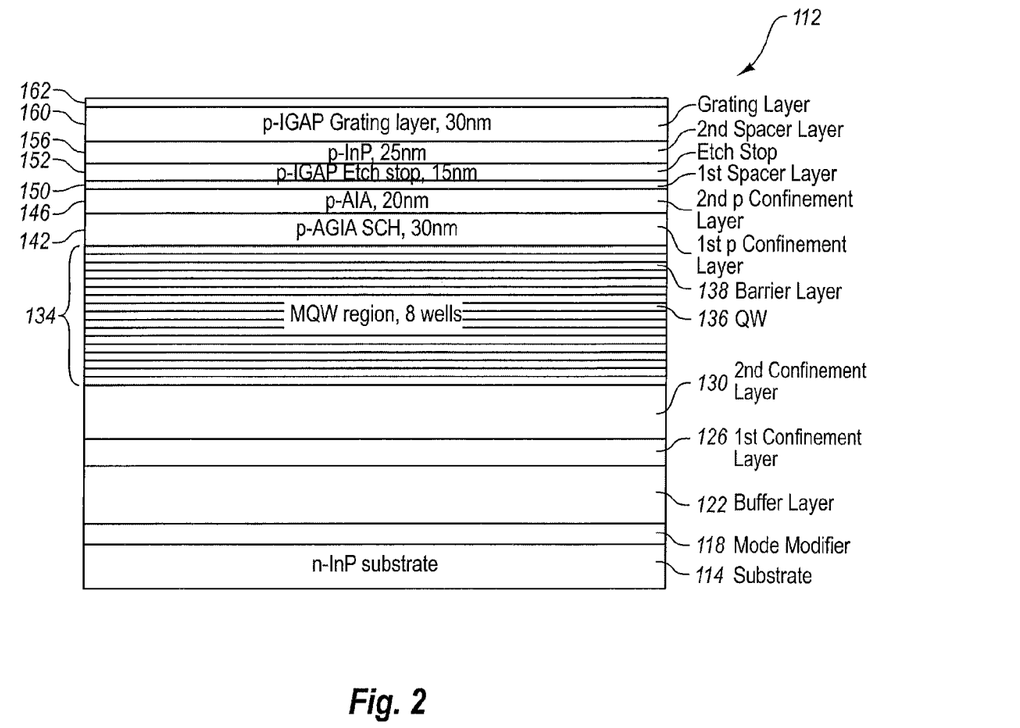
FIG. 2 is a cross sectional side view of an epitaxial base portion of a distributed feedback ("DFB") laser, according to one embodiment of the present invention.

FIG. 2 illustrates layers of a base epitaxial portion 112 of a 10 G DFB laser, generally designated at 110, at a stage prior to etching of the grating layers. The DFB laser 110 is grown on an Indium Phosphide substrate (n-InP substrate) 114.

A "mode modifier" layer (n-IGAP Mode Modifier) 118 is grown on top of the substrate 114 using Indium Gallium Arsenide Phosphide at an approximate thickness of 120 nm. This layer functions to reduce the power of second-order transversal modes that propagate within the laser structure. In particular, the mode modifier layer 118 effectively increases the loss associated with these second-order transverse modes and couples the modes away from the gain medium of the laser. This suppression of second-order transverse modes allows for wider mesa widths on the laser because the laser is less sensitive to these modes.

A buffer layer (n-InP) 122 is made of Indium Phosphide and grown on top of the "mode modifier" layer 118. This buffer layer is approximately 1.4 μm thick and provides a surface on which the n-layers of the laser are grown.

A first n-confinement layer 126 of Aluminum Indium Arsenide (n-AIA) is grown at a thickness of approximately 20 nm on the buffer layer and is doped with silicon. A second n-confinement layer 130 of Aluminum Gallium Indium Arsenide (n-AGIA SCH) is grown at a thickness of 30 nm on the n-AIA layer and is also doped with silicon. Both of these layers are current confinement layers and effectively maintain electrons within the laser active region so that photons are produced. The n-AGIA SCH second n-confinement layer 130 is graded to improve the confinement characteristics of the layer. The thicknesses of these n-layers were designed to be thin in order to optimize the thermal performance of the laser.

A multi-quantum well active region (MQW region) 134 is grown on the n-type confinement layers. The active region 134 is designed to have eight wells 136 with corresponding wavelengths of ~1295 nm. Quantum barriers 138 between the wells have corresponding wavelengths of approximately 980 nm. Standard barrier wavelengths are in the range of 1060-1090 nm and thus have smaller barrier heights than the present multi-quantum-well design. The depth and width of the wells are designed to produce a 1310 nm photon. The active region is designed to be "strain compensated" which means that the barriers are designed to have opposing strain characteristics relative to the well strain characteristics. As a result, the strain generated from the barriers at least partially cancels the strain generated by the wells and reduces the overall strain on the layer. The present well design is intentionally manufactured so that a complete cancellation of strain does not occur, but a small amount of strain remains for performance reasons.

In addition, the layers of the MQW region 134 are intentionally doped with Zn, to maintain a low-level p-type doping. This is done to assure that the p-n junction of the laser diode always occurs in the same place, and is not made variable by unpredictable dopant diffusion processes.

A first p-confinement layer 142 of Aluminum Gallium Indium Arsenide (p-AGIA SCH) is grown on the active region at a thickness of 30 nm and is doped with zinc. A second p-confinement layer 146 of Aluminum Indium Arsenide (p-AIA) is grown at a thickness of 20 nm on the p-AGIA SCH layer and is also doped with zinc. Both of the p-layers are confinement layers and effectively maintain holes within the active region so that photons are produced. The p-AGIA SCH layer 142 is graded to improve the confinement characteristics of the layer. The thicknesses of these p-layers were designed to be thin in order to optimize the speed and thermal performance of the laser.

A spacer layer 150 is located above the p-confinement layers. This spacer layer is made of Indium Phosphide and is approximately 5 nm in thickness. The thinness of the spacer layer improves the coupling efficiency of the grating and improves the speed of the laser. In particular, the spacer layer effectively controls the degree to which lateral current spreading occurs between the bottom of the ridge mesa and the active region.

Various "above-active" grating layers are located above the spacer layer. An etch stop layer (p-IGAP etch stop) 152 made of Indium Gallium Arsenide Phosphide and having a thickness of 15 nm is grown on the spacer layer 150. This etch stop layer is provided for stopping the mesa etch.

A second spacer layer 156 is provided to separate the etch stop layer 152 and the grating layer. In the illustrated design, the grating etch step is timed to stop within this spacer layer. The layer is made of Indium Phosphide (p-InP) at a thickness of 25 nm.

A grating layer (p-IGAP) 160 is grown on the second spacer layer 156 and is made of Indium Gallium Arsenide Phosphide at a thickness of 30 nm. The grating layer is "above active" (as compared to other possible designs in which the grating is below the active region). Laser holography, wet etching, and subsequent InP regrowth, as explained further below, are used to create a uniform grating, consisting of alternating layers of high index IGAP and low index InP down the length of the laser cavity.

The laser cavity of the DFB laser 110 can support two degenerate longitudinal grating modes because the grating formed in the grating layer 160 is uniform (as opposed to, e.g., a quarter-wave shifted design). Selection of one or the other of these two modes is dependent upon the phase associated with the facet cleave, which is dependent upon the location of the cleave with respect to the grating period. Because the location of the cleave cannot be controlled with sufficient precision, all phase possibilities will be represented by any ensemble of devices of this design. As a result, there will always be a finite percentage of laser parts for which both grating modes are equally supported, resulting in inadequate single-mode behavior. These lasers are discarded and not sold.

A top layer 162 is provided above the grating layer on which regrowth of other layers is performed. This top layer is a thin layer of Indium Phosphide, which may be 10 nm in one embodiment.

b. Grating Fabrication and Regrowth

Figure 3:
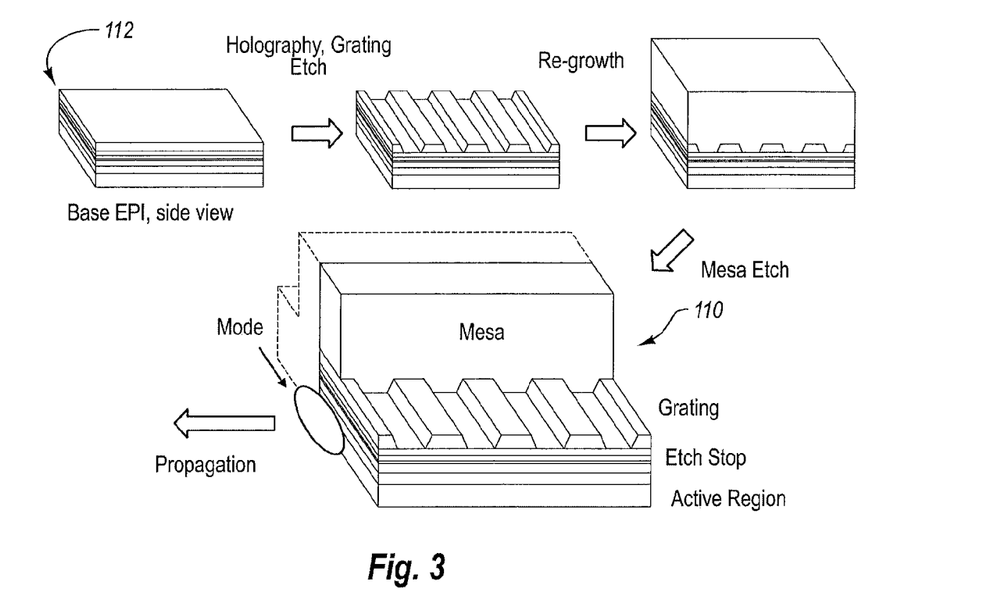
FIG. 3 is a progressive view of various processing and manufacture stages performed on the epitaxial base portion shown in FIG. 2.

FIG. 3 illustrates various grating fabrication and subsequent regrowth stages employed in forming portions of the structure of the DFB laser 110. In particular, FIG. 3 shows a side view of the base epitaxial structure 112 of FIG. 2, together with subsequent grating fabrication and regrowth of the DFB laser 110. As described above and by way of brief overview, a wet etch is performed to etch periodic gaps within the grating layer. After the etch is completed and the grating teeth are created, thick Indium Phosphide is grown on the etched, base epitaxial structure, in order to fill the gaps with low-index InP and also to form the mesa layer. The regrowth is completed with an Indium Gallium Arsenide layer for electrical contact.

This regrowth Indium Phosphide is used to create a mesa on the epitaxial base that provides current confinement and also functions as a waveguide, by virtue of lateral optical confinement. This structure is also referred to herein as a "ridge waveguide" structure. Photoresist is used to etch ridges on the regrowth that creates ridges to define the mesa of the DFB laser. Both dry and wet etching may be used in creating the mesa ridges.

After the etching process, a dielectric layer is placed on the structure. In the present design, a "triple stack" of Silicon Nitride, Silicon Dioxide, and Silicon Nitride is used as the dielectric, although other dielectrics may be used. This layer is typically thick in order to reduce parasitic capacitance (and improve speed) and is used to confine the current within the mesa. The dielectric layer is removed from the top of the mesa to allow an electrical contact and metallic layer to be placed on the mesa.

Electrical contact is made by depositing metal onto the Indium Gallium Arsenide layer at the top of the mesa. This contact is both a non-alloy contact and a low penetration contact.

A metallic layer is placed on the electrical contact to which electrical current may be provided to the laser structure. In the present embodiment, the metallic layer is made of three sub-layers of titanium, platinum and gold, although other materials could be used. A titanium layer is placed directly on the electrical contact layer, then a platinum layer and a gold layer is applied. This metallic layer provides sufficient conductivity to the Indium Gallium Arsenide layer so that current can be properly provided to the laser structure. Bottom electrical contacts are generated by thinning the InP substrate and placing an n-type metallic layer on the bottom.

A DFB laser is removed from a wafer using common techniques such as cleaving and breaking the wafer both horizontally and laterally to separate each laser. After this process, AR and HR coating is performed to encapsulate the active region of the laser and provide the requisite reflectivity characteristics of the laser cavity. The reflectivity characteristics define the optical power emitted from the back of the laser and the front of the laser. In uniform grating designs, a majority of the optical power is emitted from the front of the laser which couples into optical fiber. A minority of the optical power is emitted from the back of the laser which may couple with a photodetector (not shown) that is used to monitor the laser performance.

In one embodiment, the coating is made of layers of Silicon Oxide and Silicon. The reflectivity of the AR coating is designed to be less that 1% and the HR coating is designed to be greater than 96%. Once the coating process is complete, a testing process may be performed in which the power characteristics and optical spectrum are tested.

The example DFB laser 110 and photodetector are packaged into an optical sub-assembly, which is subsequently packaged into an optical module along with driver and control integrated circuits such as transceiver 100.

Example Operational Aspects of a High-Speed Laser

Figure 4:
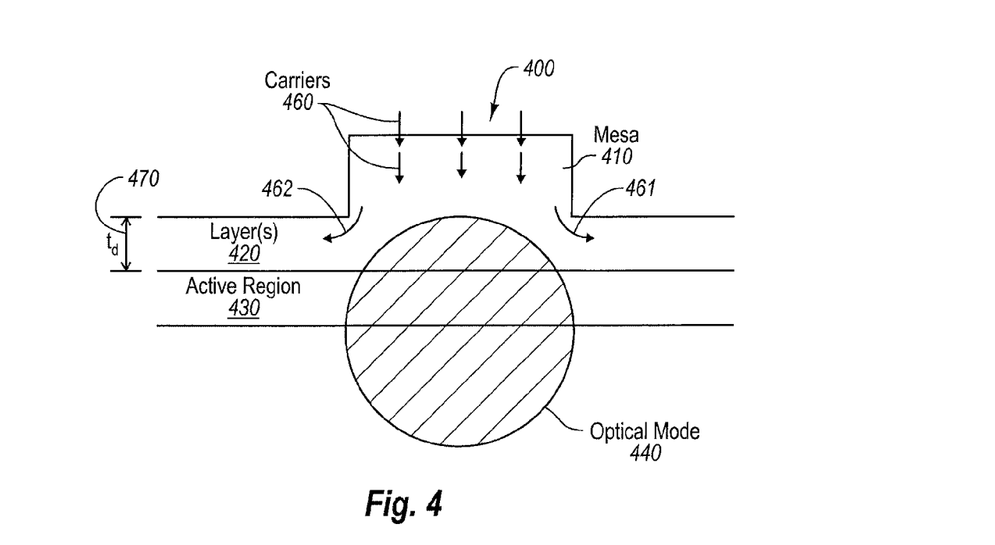
FIG. 4 is a side view of a high-speed laser showing an optical mode.

Reference is now made to FIG. 4, which illustrates a side view of a high-speed laser 400 such as the DFB laser 110 previously described with respect to FIGS. 2 and 3. As mentioned previously, the mesa 410 of the high-speed laser 400 functions as a waveguide that substantially confines the optical mode 440 within the lateral dimensions of the mesa 410. This confinement allows for more efficient carrier injection into the laser.

For example, application of electrical current to mesa 410 causes electrical carries 460 to be injected into the mesa 410. The electrical carriers 460, which may be holes if mesa 410 is a p-type material such as the mesa of laser 110 or electrons if the mesa is an n-type material, are injected towards the active region 430.

As illustrated, however, some of the carriers, illustrated as carriers 461 and 462, may be subject to lateral current spreading in the layer(s) 420 that are disposed between the active region 430 and the mesa 410. Such lateral current spreading prevents carriers 461 and 462 from contributing to the optical mode 440 of the laser. In effect, carriers 461 and 462 are wasted. As previously mentioned, if too many carriers 460 are subjected to lateral current spreading, both the gain and differential gain of the laser is reduced, which in turn may negatively affect the DC and RF performance of the laser.

Advantageously, reducing the thickness of layer(s) 420, denoted as $t_d$ 470 in FIG. 4, as much as possible has the effect of minimizing the distance between mesa 410 and active region 430. The minimized distance may result in reduced lateral current spreading of carriers 460 between the mesa layer 410 and the active region 430. Note that layer(s) 420 may be a single layer or it may represent any number of layers disposed between the mesa 410 and the active region 430.

For example, in the embodiment described in relation to FIGS. 2 and 3, layer(s) 420 may correspond to the etch stop layer 152, whose the top edge may be considered the floor of the mesa layer, InP spacer layer 150, and confinement layers 146 and 142. In embodiments where grating region 160 is on top of the active region, the floor of the mesa is the top edge of the etch stop layer 152 for approximately 50% of the time and the floor of the mesa is the top edge of the grating layer 160 for the other approximately 50% of the time as illustrated in FIG. 3. In such embodiments, the thickness of the grating layer 160 and the spacer layer 156 are also part of thickness 470 for the 50% that the floor of the mesa includes the top edge of grating layer 160.

As mentioned, reducing the thickness of the layers 142, 146, 150, 152 (and layers 156 and 160 for embodiments with an above active region grating as previously described), either singularly or in combination, may have the effect of minimizing the distance from active region 134 to the mesa. The doping of these layers may be modified to change their thicknesses to achieve the minimized distance.

Of particular importance is the desirability to minimize the thickness of InP spacer layer 150 due to the fact that lateral spreading mobility is highest in this layer. As illustrated in FIG. 2, in one embodiment InP layer 150 may be implemented with a thickness as thin as 5 nm. In addition, the AIA confinement layer 146 and the AGIA SCH confinement layer 142 may be implemented with a thickness of 20 nm and 30 nm respectively. In this particular embodiment, using these thicknesses for the layers has been found to minimize the lateral current spreading between mesa and the active region. Of course, it will be appreciated that other layer thicknesses for these layers as well as other layers between the active region and the mesa may also be implemented as circumstances warrant. Accordingly, the specific thicknesses for any layers disclosed in this specification are for illustration only and should not be used to limit the scope of the appended claims unless explicitly stated.

Reducing the lateral current spreading in this manner has several significant results. For example, by keeping the lateral dimension over which carriers 460 are injected into the active region 430 as close as possible to the lateral dimension of mesa 410, which occurs when there is minimized lateral current spreading, the overlap between the injection profile and the optical mode is maximized. This optimizes the conversion of carriers 460 by the laser into photons, resulting in optimized gain and differential gain, which improves DC and RF performance respectively. In addition, device voltage and resistance are reduced, resulting in reduced heat generation. Finally, reducing the thickness of quaternary layers such as the confinement layers may result in reduced thermal resistance of the device.

Figure 5:
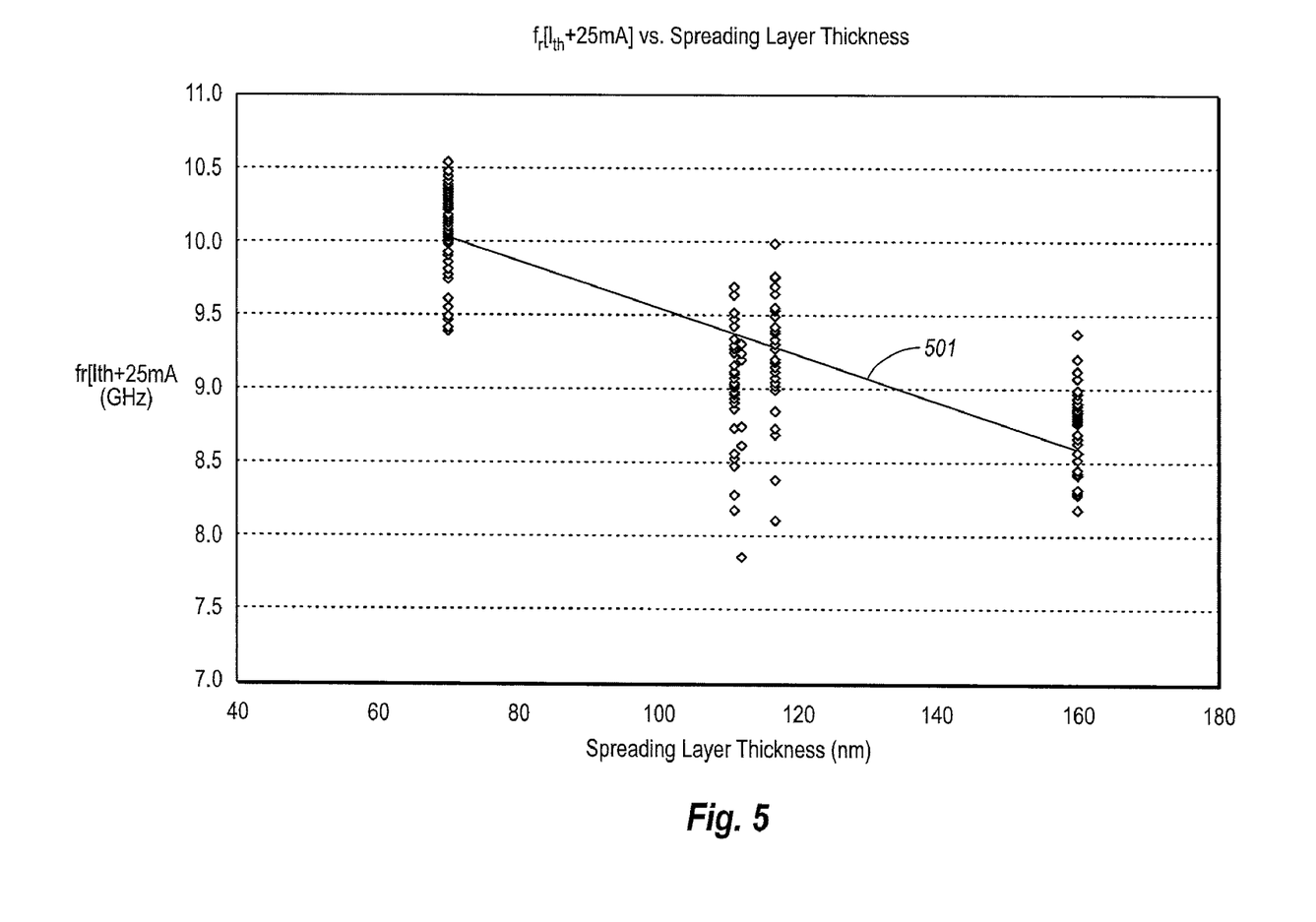
FIG. 5 is a scatter plot showing the resonance frequency vs. the spreading thickness of a high-speed laser.

Reference is now made to FIG. 5, which illustrates a scatter plot showing the increased performance benefits when reducing the thickness of layer(s) 420 in the manner previously described. The plot shows resonance frequency vs. the spreading layer thickness (i.e., the thickness of layer(s) 420 of a high-speed laser). The resonance frequency is a measure of the speed performance of the laser. Accordingly, the higher the resonance frequency, the better the laser performance. As mentioned above, the spreading layer thickness is defined as the distance between the floor of the mesa and the active region.

The plot of FIG. 5 depicts a diagonal curve 501. At a spreading layer thickness of approximately 70 nm, the resonance frequency is between 9.4 and 10.6 GHz, with an average of approximately 10 GHz. At a spreading layer thickness between 100 and 120 nm, the resonance frequency is approximately 9.3 GHz. Finally, at the spreading thickness of 160 nm, the resonance frequency is between 8.2 and 9.4 GHz, with an average of approximately 8.6 GHz. Accordingly, curve 501 shows that as the thickness of layer(s) 420 is reduced, thereby bringing the active region and the mesa closer together and reducing the lateral current spreading, the performance of the laser corresponding increases.

Although the above description was specifically tailored to a DFB laser, the embodiments disclosed herein may also be used in other high-speed lasers, such as a 1310 nm 10 G Fabry Perot laser. The Fabry Perot laser, as is known in the art, is also grown on a substrate with various layers, a mesa and an active layer. Accordingly, the Fabry Perot laser may also be subject to lateral current spreading in the layer(s) between the active layer and the mesa. Reducing the thickness of the layer(s) between the mesa and the active layer will minimize the distance between the mesa and the active layer and result in the same performance enhancements.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A high-speed laser comprising:
   a substrate;
   an active region positioned above the substrate;
   a mesa positioned above the active region;
   a first confinement layer positioned above the active region;
   a second confinement layer positioned above the first confinement layer; and
   a first spacer layer positioned above the second confinement layer.

2. The laser as recited in claim 1, wherein the first confinement layer comprises a zinc doped, Aluminum Gallium Indium Arsenide layer of approximately 30 nm thickness.

3. The laser as recited in claim 1, wherein the second confinement layer comprises a zinc doped, Aluminum Indium Arsenide layer of approximately 20 nm thickness.

4. The laser as recited in claim 1, wherein the first spacer layer comprises an Indium Phosphide layer of approximately 5 nm thickness.

5. The laser as recited in claim 1, wherein the one or more layers disposed between the active region and the mesa further includes at least a portion of:
   an etch stop layer positioned above the first spacer layer;
   a second spacer layer positioned above the etch stop layer; and
   a grating layer positioned above the second spacer layer.

6. The laser as recited in claim 5, wherein the etch stop layer comprises an Indium Gallium Arsenide Phosphide layer of approximately 15 nm thickness, the second spacer layer comprises an Indium Phosphide layer of approximately 25 nm thickness, and the grating layer comprises a Indium Gallium Arsenide Phosphide layer of approximately 30 nm thickness.

7. The laser as recited in claim 1, wherein the laser is an FP laser.

8. The laser as recited in claim 1, wherein the laser is a DFB laser.

9. A DFB laser comprising:
   a mode modifier layer positioned above the substrate;
   a buffer layer positioned above the mode modifier layer;
   a first confinement layer positioned above the buffer layer;
   a second confinement layer positioned above the first confinement layer and below the active region;
   a third confinement layer positioned above the active region;
   a fourth confinement layer positioned above the third confinement layer;
   a first spacer layer positioned above the fourth confinement layer;
   an etch stop layer positioned above the first spacer layer;
   a second spacer layer positioned above the etch stop layer;
   a grating layer positioned above the second spacer layer; and
   a top layer positioned above the grating layer and below the mesa.

10. The laser as recited in claim 9, further wherein:
   the substrate, the mode modifier layer, the first confinement layer, and the second confinement layer are n-type layers;
   the third confinement layer, the fourth confinement layer, the first spacer layer, the etch stop layer, the second spacer layer, and the grating layer are p-type layers; and
   a doping material of the active region is a p-type material.

11. The laser as recited in claim 9, further wherein:
   the substrate, the mode modifier layer, the first confinement layer, and the second confinement layer are p-type layers; and
   the third confinement layer, the fourth confinement layer, the first spacer layer, the etch stop layer, the second spacer layer, and the grating layer are n-type layers; and
   a doping material of the active region is an n-type material.

12. A TOSA comprising:
   a housing; and
   the laser as recited in claim 1 positioned within the housing.

13. An optical transceiver module comprising:
   the TOSA as recited in claim 12;
   a ROSA; and
   a PCB in electrical communication with the TOSA and the ROSA.

14. The laser as recited in claim 1, wherein at least partially minimizing the distance between the mesa and active region such that lateral current spreading between the mesa and the active region is at least partially minimized improves DC and RF performance of the laser.

15. A DFB laser, comprising:
   An n-type substrate;
   an active region positioned above the substrate;
   a mesa positioned above the active region;
   a first p-type confinement layer positioned above the active region;
   a second p-type confinement layer positioned above the first p-type confinement layer;
   a first p-type spacer layer positioned above the second p-type confinement layer;
   a p-type etch stop layer positioned above the first p-type spacer layer;
   a second p-type spacer layer positioned above the p-type etch stop layer; and
   a p-type grating layer positioned above the second p-type spacer layer.

16. The DFB laser as recited in claim 15, further comprising
   an n-type mode modifier layer positioned above the n-type substrate;
   a buffer layer positioned above the n-type mode modifier layer;
   a first n-type confinement layer positioned above the buffer layer;
   a second n-type confinement layer positioned above the n-type first confinement layer and below the active region; and
   a top layer positioned above the p-type grating layer and beneath the mesa.

17. The DFB laser as recited in claim 15, wherein the first p-type confinement layer comprises a zinc doped, Aluminum Gallium Indium Arsenide layer of approximately 30 nm thickness, the second p-type confinement layer comprises a zinc doped, Aluminum Indium Arsenide layer of approximately 20 nm thickness, the first p-type spacer layer comprises an Indium Phosphide layer of approximately 5 nm thickness, the p-type etch stop layer comprises an Indium Gallium Arsenide Phosphide layer of approximately 15 nm thickness, the second p-type spacer layer comprises an Indium Phosphide layer of approximately 25 nm thickness, and the p-type grating layer comprises a Indium Gallium Arsenide Phosphide layer of approximately 30 nm thickness.

18. The DFB laser as recited in claim 15, wherein the DFB laser is configured to operate at 10 Gbit.

19. A TOSA comprising:
   a housing; and
   the DFB laser as recited in claim 15 positioned within the housing.

20. An optical transceiver module comprising:
   the TOSA as recited in claim 19;
   a ROSA; and
   a PCB in electrical communication with the TOSA and the ROSA.

* * * * *